(12) United States Patent
Brown (10) Patent No.: US 7,368,667 B2
(45) Date of Patent: May 6, 2008

(54) USING ROWS/COLUMNS OF MICRO-VIAS TO CREATE PCB ROUTING CHANNELS IN BGA INTERCONNECT GRID (MICRO-VIA CHANNELS)

(75) Inventor: Paul James Brown, Wakefield (CA)

(73) Assignee: Alcatel, Paris (FR)

( * ) Notice: Subject to any disclaimer, the term of this patent is extended or adjusted under 35 U.S.C. 154(b) by 67 days.

(21) Appl. No.: 11/200,041

(22) Filed: Aug. 10, 2005

(65) Prior Publication Data

US 2007/0034405 A1    Feb. 15, 2007

(51) Int. Cl.
*H01R 12/04*    (2006.01)
*H05K 1/11*    (2006.01)

(52) U.S. Cl. .................................... 174/262; 361/792

(58) Field of Classification Search ................ 174/260, 174/262–266; 361/792–795
See application file for complete search history.

(56) References Cited

U.S. PATENT DOCUMENTS

| | | | | |
|---|---|---|---|---|
| 6,232,564 | B1* | 5/2001 | Arndt et al. ................. | 174/266 |
| 6,407,344 | B1* | 6/2002 | Horiuchi et al. ............ | 174/261 |
| 6,534,872 | B1* | 3/2003 | Freda et al. ................. | 257/774 |

* cited by examiner

*Primary Examiner*—Jeremy C Norris
(74) *Attorney, Agent, or Firm*—Jim Zegeer (57) ABSTRACT

A printed circuit board having micro-vias used to connect a portion of the contacts in a selected row or column to the first internal layer of the board, thereby creating routing channels on the second and subsequent internal layers of the board between selected rows or columns of through-board vias used to connect the remaining contacts and a BGA package adapted to be used with the printed circuit board.

5 Claims, 9 Drawing Sheets

USING ROWS/COLUMNS OF MICRO-VIAS TO CREATE PCB ROUTING CHANNELS IN BGA INTERCONNECT GRID (MICRO-VIA CHANNELS)

REFERENCE TO RELATED APPLICATIONS

The present application is related to the following U.S. patent applications which are assigned to the assignee hereof:

Ser. No. 10/991,360 filed Nov. 19, 2004, inventor Paul Brown entitled OFF-WIDTH PITCH FOR IMPROVED CIRCUIT CARD ROUTING; and Ser. No. 11/041,727 filed Jan. 25, 2005, inventor Alex Chan entitled OFF-GRID DECOUPLING OF BALL GRID ARRAY (BGA) DEVICES.

BACKGROUND OF THE INVENTION

This invention relates to increasing the efficiency with which signals from area array packages (BGAs and CGAs) are extracted and routed on the printed circuit boards (PCB or circuit card) on which these devices are mounted.

It is well established that the increase in area array connections (pin count) translates to an increase in the number of printed circuit board routing layers needed to support the device escape and routing circuits. The incentive for further increases in routing efficiency stem from the cost and complications related to the added layers needed to for typical routing methodologies.

At one extreme, where the area array pin count may be relatively low, implementation of higher efficiency routing methodologies are driven solely by the cost savings associated with the resulting lower layer count PCB.

As pin count increases above 1000 pins, limitations in high layer count PCB fabrication capabilities, shift the incentive towards minimizing the overall layer count, thereby improving the quality and reliability of a PCB for a given design, while also allowing the design to benefit from cost savings.

Finally, at the other extreme, area array technology is following a design trend towards higher pin counts (>2500) and finer pitches (<0.8 mm) which may not be usable at all, without improved routing solutions like the one disclosed herein.

The prior art has used shared through-vias on power and ground connections aligned in columns in order to form a routing channel (i.e. a larger space between the row of shared vias and an adjacent row) through which connections can be routed. (See FIG. 1).

The prior art solution places additional constraints on the pinout configuration of the area array device power and ground pins, which require a high degree of adherence to a specific pinout pattern which in the extreme may not be achievable by certain area array packaging styles. In general these added constraints are undesirable from a signal integrity standpoint. Furthermore, that solution involves the sharing of adjacent power and ground pins which is also an unfavorable practice due to the negative impact that it might have on device functionality.

SUMMARY OF THE PRESENT INVENTION

The object of the present invention is to provide an improved PCB and BGA package using rows/columns of micro-vias to create printed wiring boards (PWB) routing channels in a BGA that couple with BGA interconnect vias. Simple patterns, created through the intelligent reconfiguration of printed circuit board interconnect structures have been defined, which permit an increase in escape densities that in turn enable the routing of area array devices in fewer layers. These patterns provide a novel combination of through and micro-via interconnects which leverage the strength of each of these interconnects in unison to achieve a routing capability which would not be realizable with either of these interconnects when used in the customary way.

By creating columns/rows of micro-vias interspersed with columns/rows of regular through-vias as frequently as every second row, columns and rows of through-vias can be eliminated in these locations. As a result, routing channels are created on the first internal layer of the printed circuit board. These channels have several properties which favor the densification of routing: They are wider than the channels that would be created using conventional through-via routing channels, thereby enabling the passage of a greater number of traces. Additionally, the micro-vias employed in this invention cease to exist on the first internal layer, meaning that half of the interconnect is eliminated on all subsequent layers, thinning the interconnect to half of its original density in those areas where this technique is employed. As a result, the interconnect pitch (P) on the surface of the PWB which must be equal to that of the BGA is widened to 2P on all subsequent layers, greatly increasing the routing capacity in these areas.

While in theory any pinout configuration can be accommodated by this invention, in practice it is preferred to route power and ground connections with through-vias, leaving the micro-vias for the signal carrying connections. Given that every second via is designated a through-via, the limitation that this preference imposes on a given pinout is not overly burdensome.

BRIEF DESCRIPTION OF THE DRAWINGS

The above and other objects, advantages and features of the invention will become more apparent when considered with the following specification and accompanying drawings wherein.

DETAILED DESCRIPTION OF THE INVENTION

Figure 1:
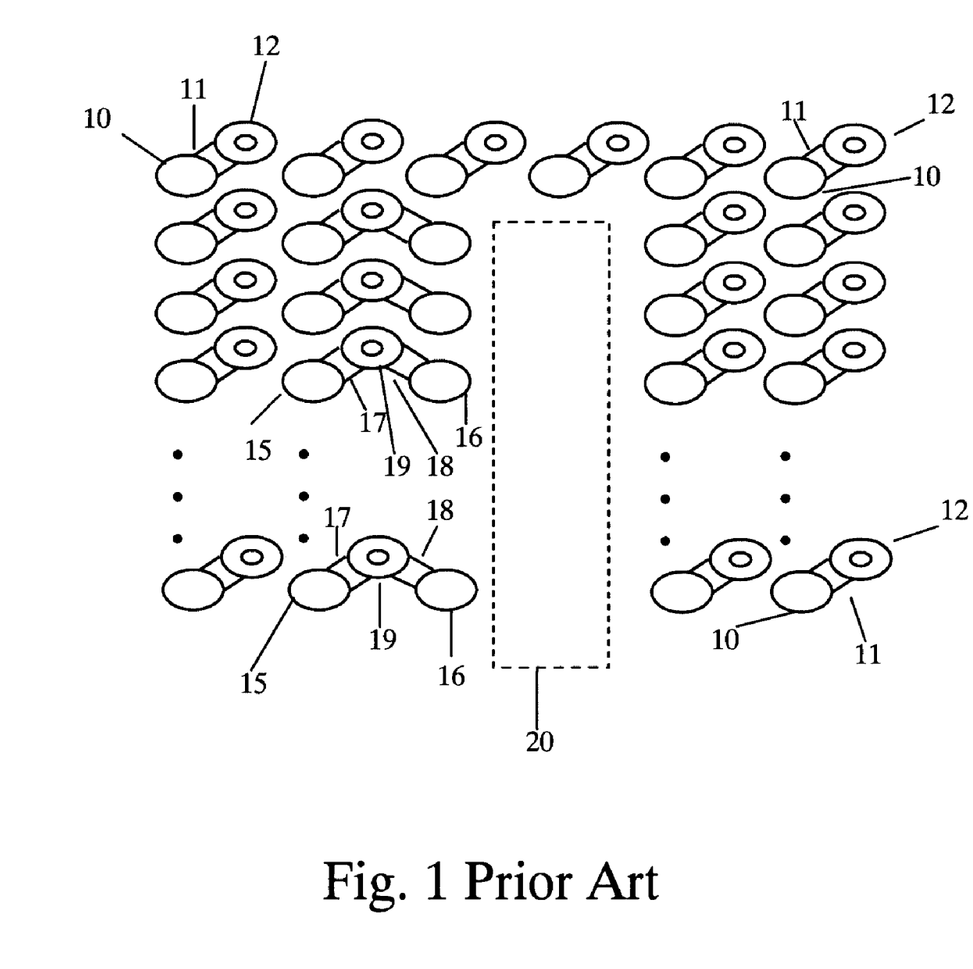
FIG. 1 is a diagrammatic illustration of a prior art printed circuit board PCB solution.

FIG. 1 is a top view of a surface layer of a printed circuit board (PCB) incorporating one prior art solution. Ball grid array (BGA) ball contact pads 10 are linked by links 11 to through-board vias 12. In order to provide a routing channel 20, selected rows of ball contact pads 15 and 16 are connected through links 17 and 18 to common through-board vias 19 which are designated herein as shared through-board vias. See the above discussion for the disadvantages of this solution.

Figure 2A:
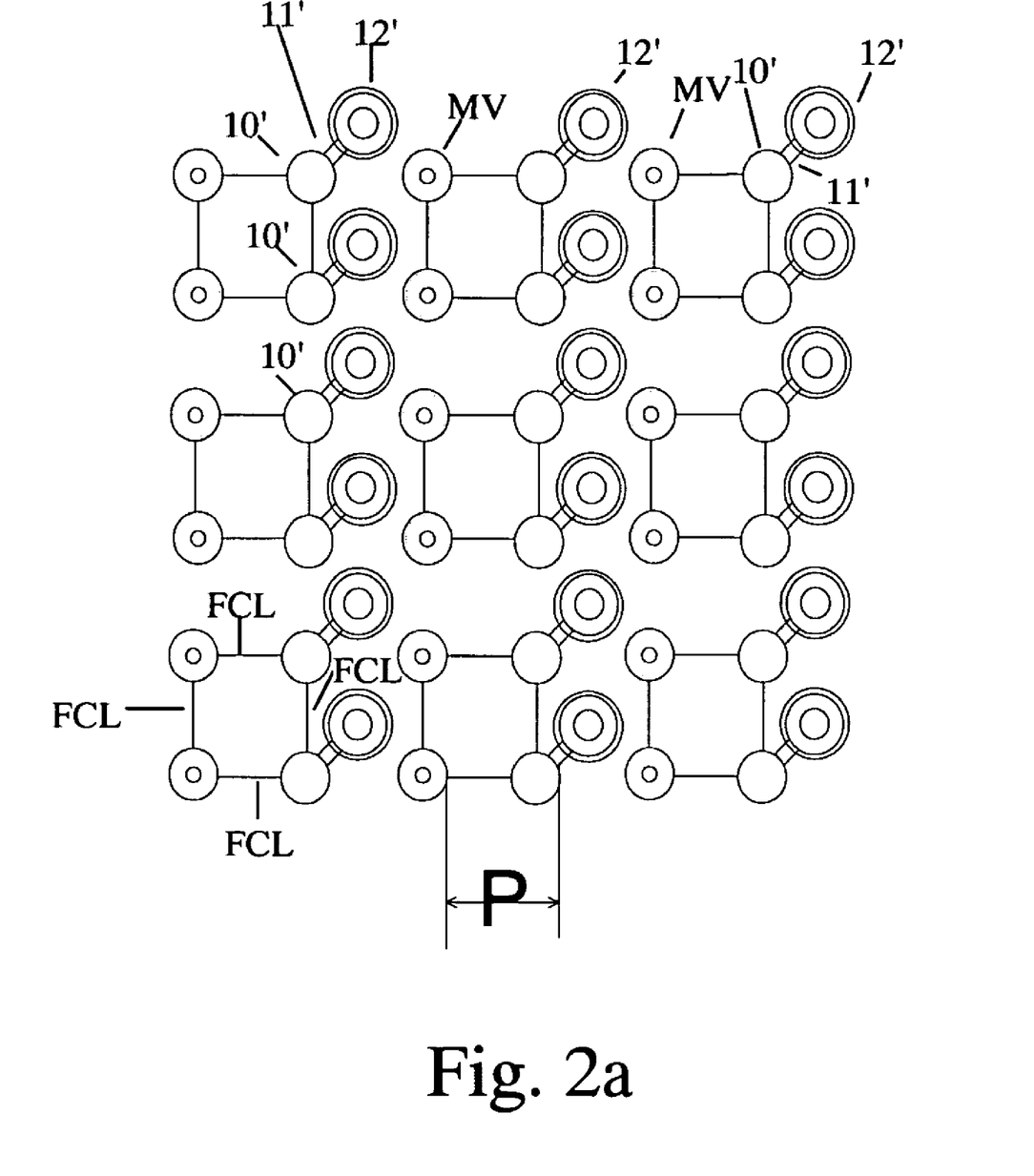
FIGS. 2a, 2b and 2c are diagrammatic representations of layers 1, 2 and 3, respectively, of a PCB incorporating the invention (with fictitious construction lines (FCL) to delineate the original BGA pitch and highlight the effect of interconnect transformations on interconnect pitch and resulting routing channel widths)
Figure 2B:
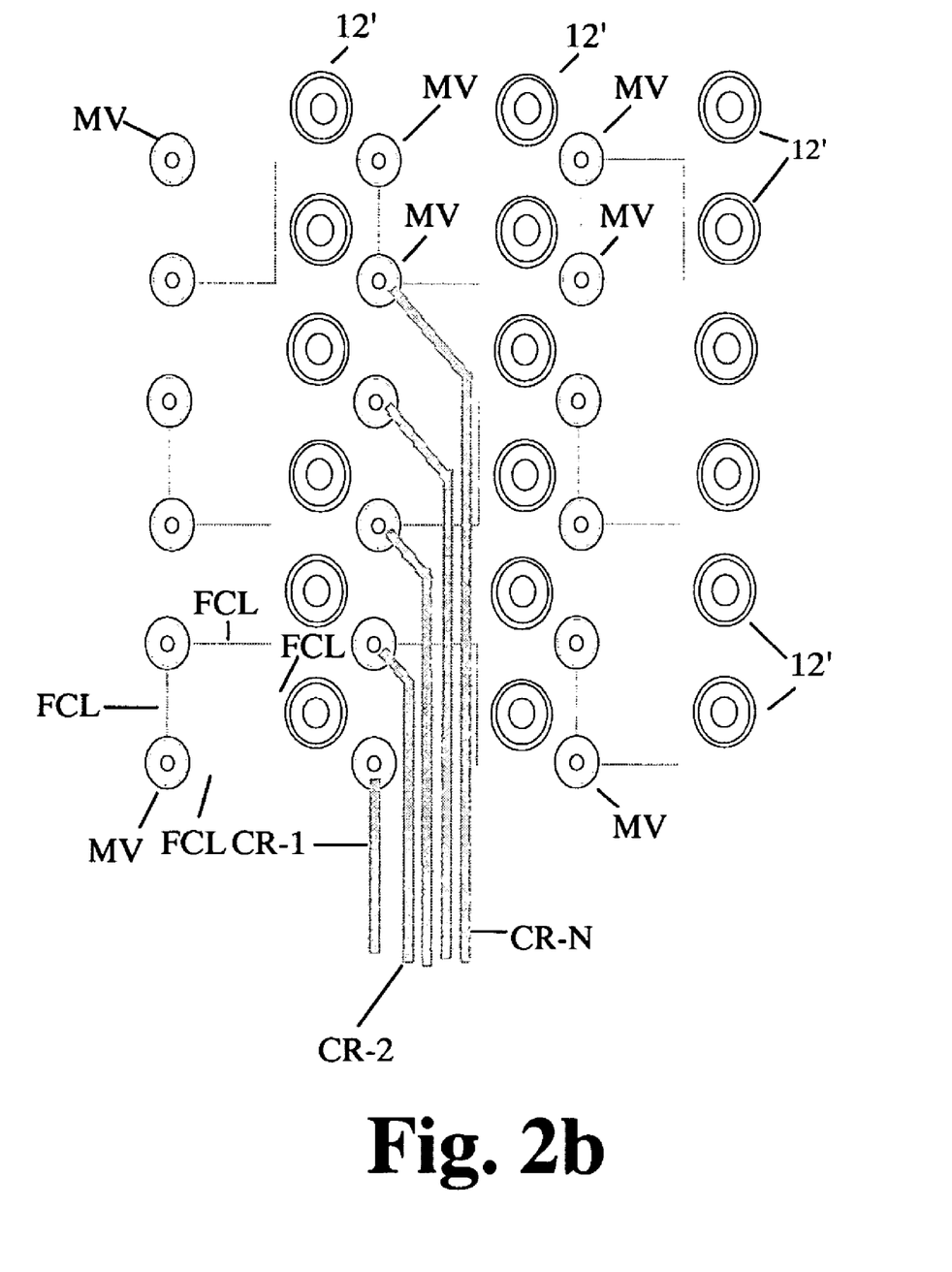
Figure 2C:
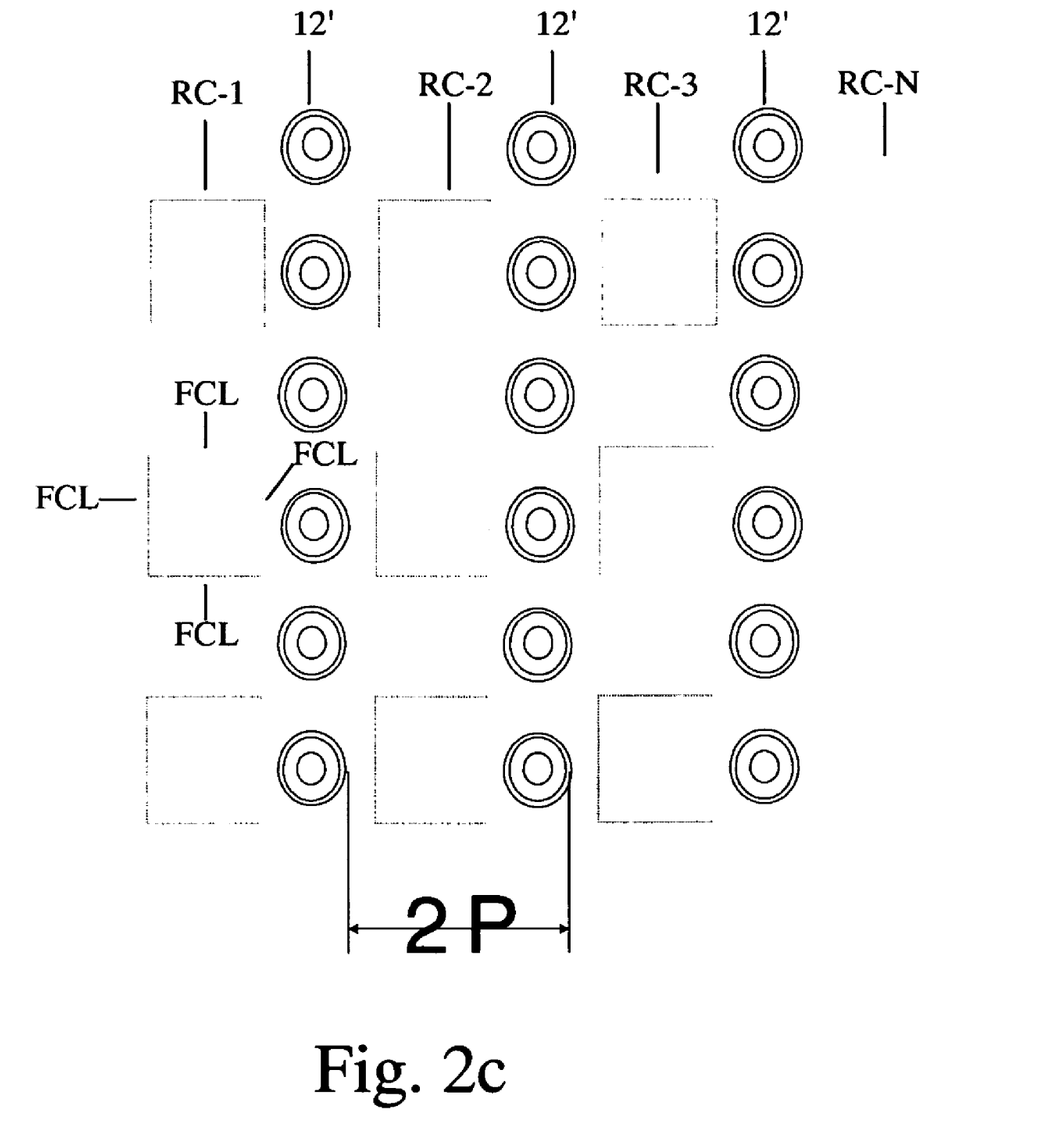
Figure 2D:
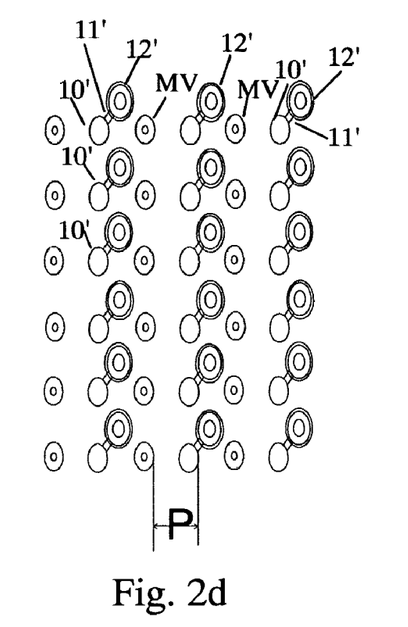
FIGS. 2d, 2e and 2f are the same as FIGS. 2a, 2b and 2c with the fictitious construction lines removed.
Figure 2E:
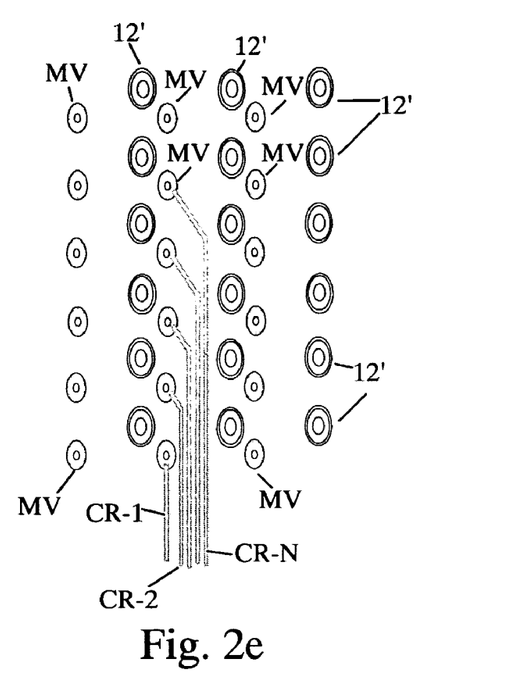
Figure 2F:
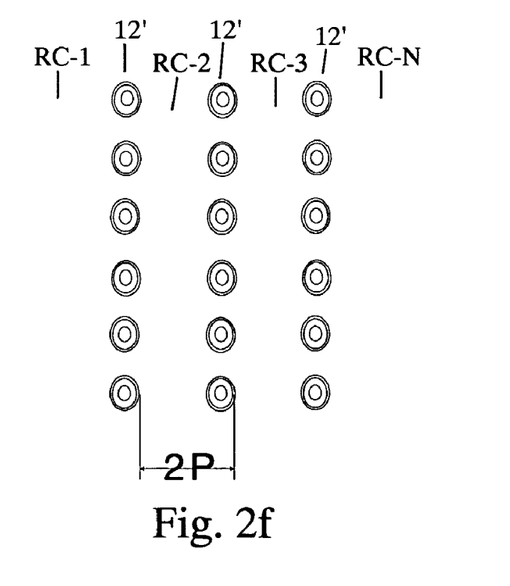

The present invention is illustrated in FIGS. 2a, 2b and 2c. (The elements with prime numerals correspond to elements in FIG. 1.) The first three circuit board layers are shown to illustrate the requirements of the BGA package.

By creating columns and/or rows of micro-vias interspersed with columns/rows of regular through vias as frequently as every second column or row, columns and rows of through-vias can be eliminated in these locations. In FIG. 2a, columns of micro-vias MVC1, MVC2, MVC3 . . . are interspersed with columns of regular through-vias C1, C2, C3 . . . In this embodiment, the micro-vias are not provided with links to contact pads as in the case of regular through-vias. However, it is within the contemplation of this invention that the micro-vias may be provided with contact pads also. In this case, the micro-vias are in the pattern with the contact pads. FIGS. 2a, 2b and 2c include light gray squares shown in these figures which are fictitious construction lines FCL which delineate the original BGA pitch. These construction lines FCL in FIGS. 3d, 3e and 3f are intended to highlight the effect of the interconnect transformations on interconnect pitch and resulting channel widths.

FIG. 2b shows the first internal layer of the printed circuit board and shows how the micro-vias MV terminate in the first internal layer and circuit routings CR-1, CR-2 . . . CR-N from the second layer micro-vias MV. The circuit routing channels RC-1, RC-2 . . . RC-N created in the second and subsequent layers are shown in FIG. 2c. As a result, routing channels are created on the first internal layer of the printed circuit board (see FIG. 3b). These circuit routing channels have several properties which favor the densification of routing: They are wider than the channels that would be created using conventional through-via routing channels, thereby enabling the passage of a greater number of traces. Additionally, the micro-vias employed in this invention cease to exist on the first internal layer, meaning that half of the interconnect is eliminated on all subsequent layers, thinning the interconnect to half of its original density in those areas where this technique is employed (see FIG. 2c). As a result the interconnect pitch (P) on the surface of the PWB which must be equal to that of the BGA (see FIG. 2a) is widened to 2P on all subsequent layers (see FIG. 2c), greatly increasing the routing capacity in these areas. It will be appreciated that a greater pitch could be achieved by using consecutive rows or columns of micro-vias.

As noted above, any pinout configuration can be accommodated by this invention, in practice it is best to route power and ground connections with through-vias, leaving the micro-vias for the signal carrying connections. Given that every second via is designated a through-via, the limitation that this preference imposes on a given pinout is not overly burdensome.

FIGS. 3a, 3b, 3c and 3d are illustrations of BGA device pin assignments and setting power and ground pin connections by the use of micro-vias in the printed circuit board.

Figure 3A:
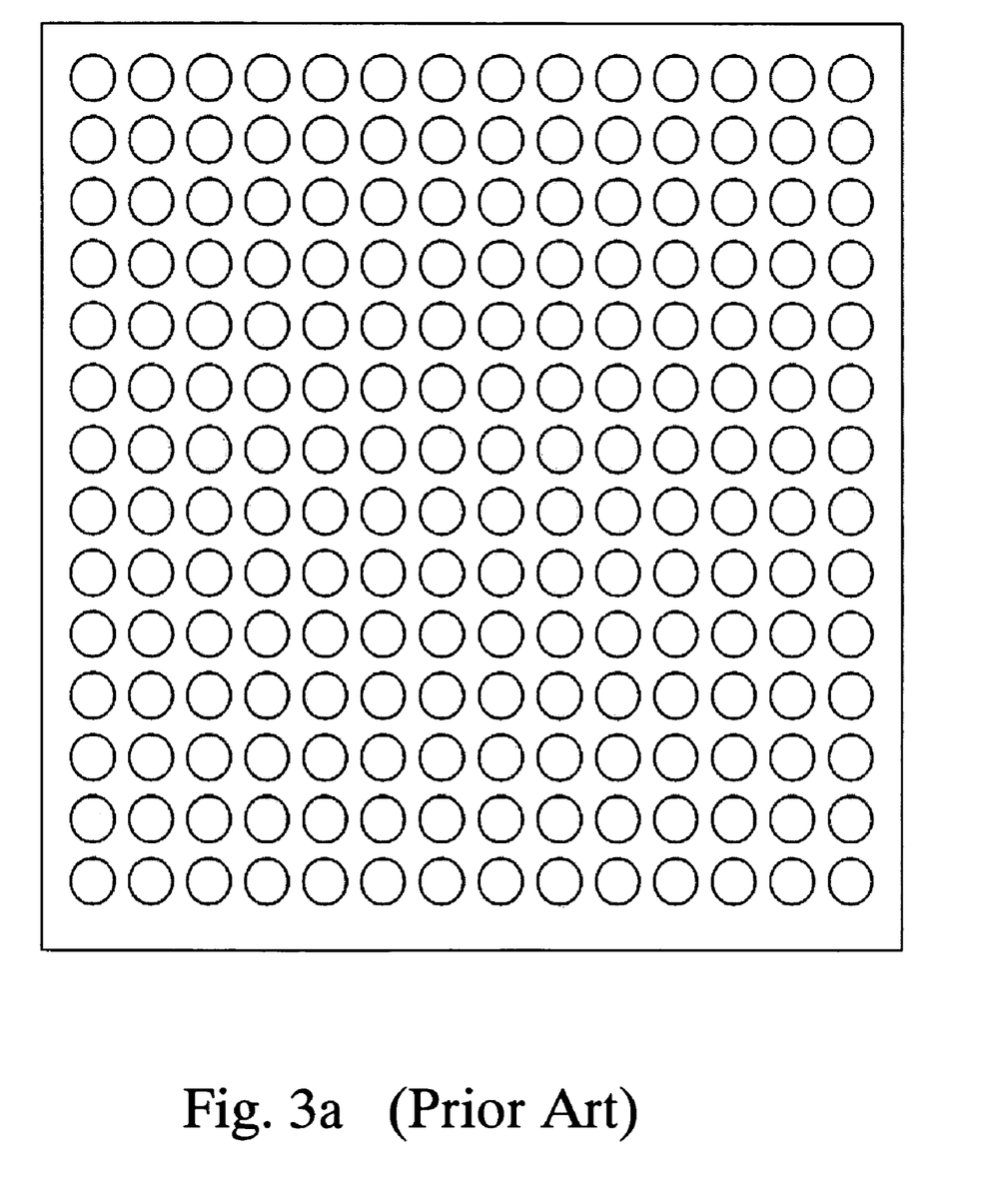
FIG. 3a is a diagrammatic illustration of an unaltered area array (BGA) pin field.
Figure 3B:
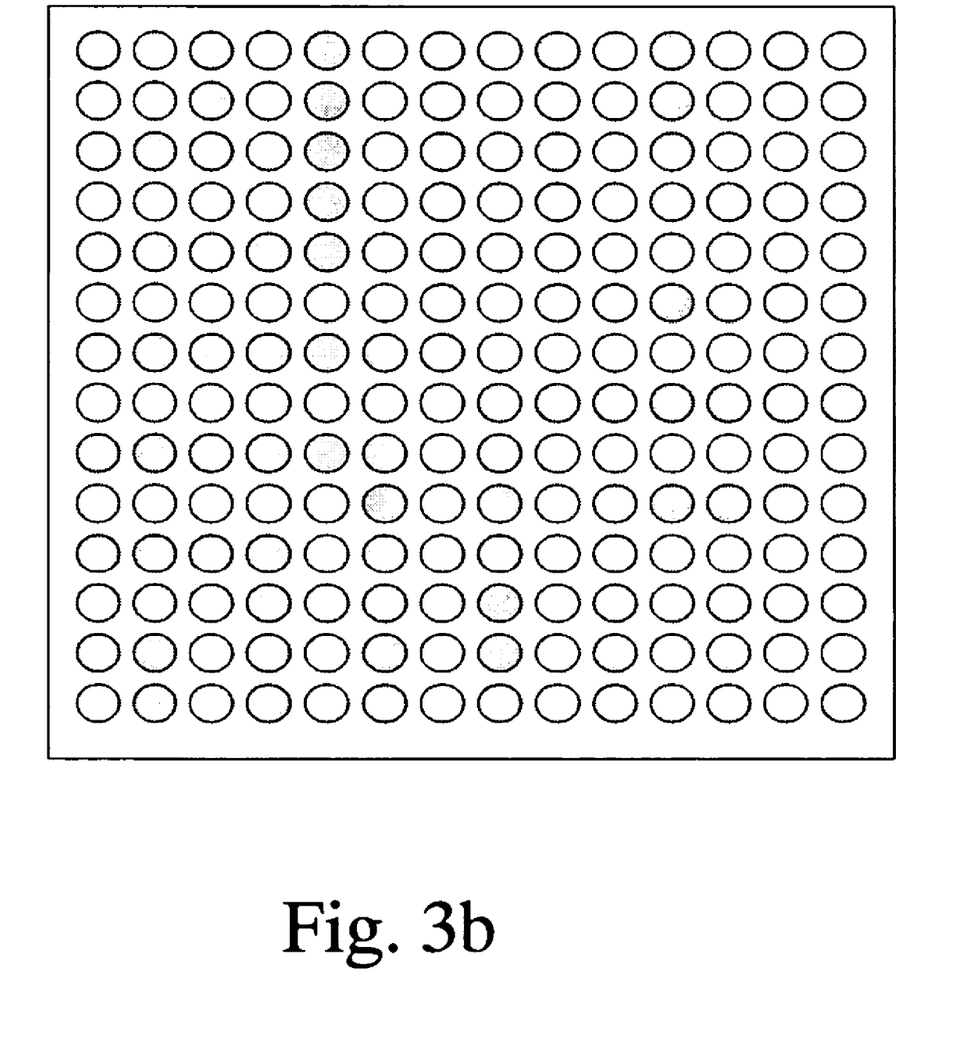
FIG. 3b is a diagrammatic illustration of an optimum BGA pinout in which preferential signal pins are reserved (white) for corresponding micro-vias.
Figure 3C:
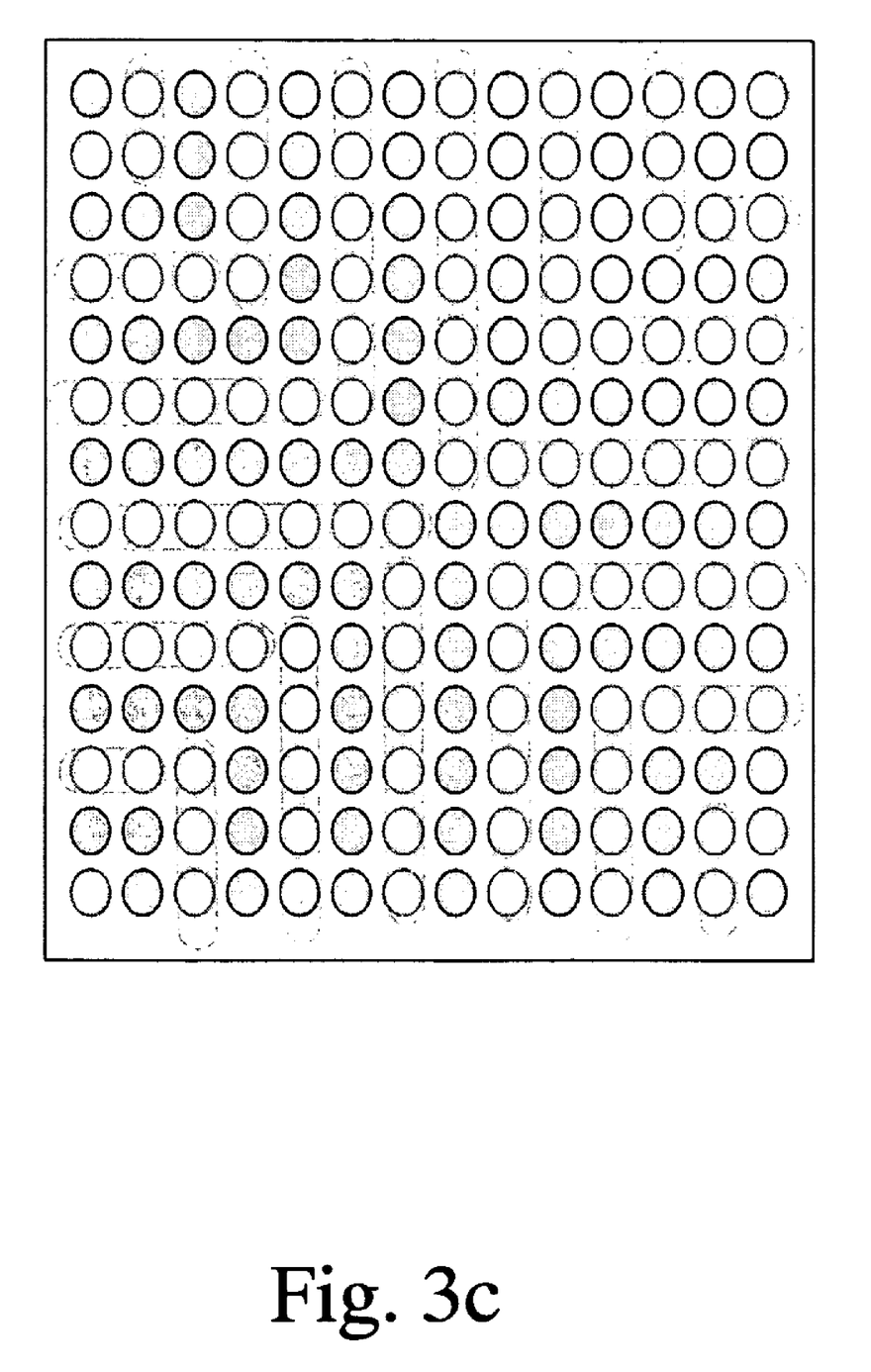
FIG. 3c is a diagrammatic illustration of future channel locations shown corresponding to signal pin locations.
Figure 3D:
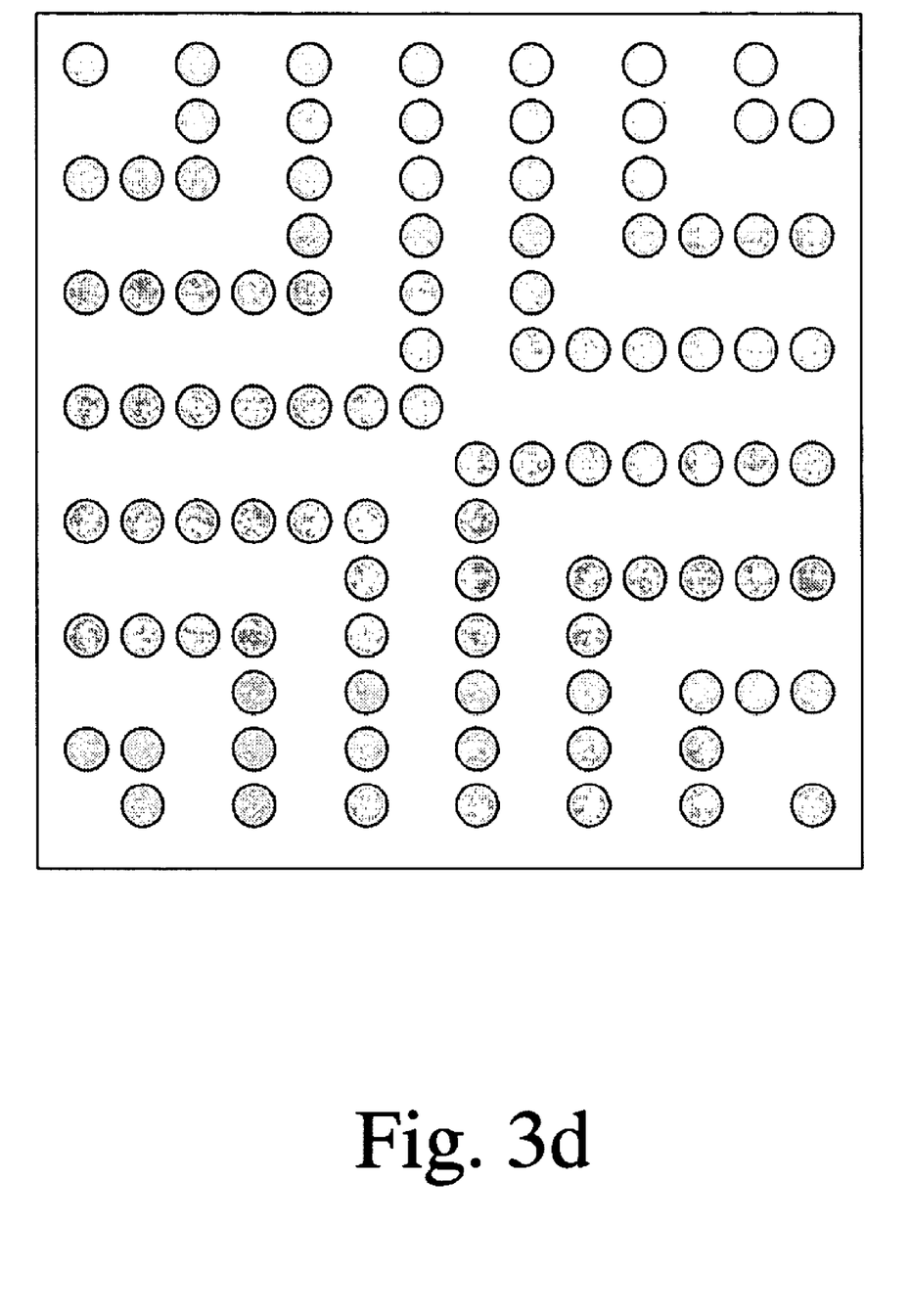
FIG. 3d is a diagrammatic illustration of remaining pin locations for pins requiring through-via interconnects.

FIG. 3a shows the unaltered area array (BGA) pin field which in this embodiment is typically square but other geometrical configurations are contemplated. FIG. 3b discloses an optimum BGA pinout in which preferential signal pins SP (white) for corresponding to micro-vias in the printed circuit board shown in FIGS. 2a-2f. FIG. 2c shows future channel locations corresponding to signal pin locations in the printed circuit board. Finally, the remaining pin locations for pins requiring through-via interconnects is shown in FIG. 3d. (Other pins are not shown for clarity of illustration.)

It will be appreciated that a software tool which automates the creation and associated routing of this grid translation method is a feature of the invention. This tool could also be used by the designer of the area array device to achieve the optimum pinout discussed above.

The invention has the advantage that it creates effective routing channels with minimal detrimental impact to signal integrity or chip decoupling solutions.

Further advantages of the present solution include:
1. Provides the capability to route high pin count devices (i.e. >1200 pins) using available board technology. This ensures supply while reducing the cost of high complexity substrates by as much as 50%.
2. Simplifies chip escape and increases routing flexibility thereby minimizing design time and by consequence overall time to market.
3. Given that high pin count devices often unnecessarily drive layer count above what is needed for the actual design routing. This solution minimizes this effect, making designs more efficient and cost effective.

While the invention has been described in relation to preferred embodiments of the invention, it will be appreciated that other embodiments, adaptations and modifications of the invention will be apparent to those skilled in the art.

While the embodiment may put some limitations on the placement of power and ground connections since typically half of the position are still available for power and ground, and up to only a third of the connections are typically used for power and ground, this limitation should not be too onerous.

What is claimed is:

1. A layered printed circuit board (PCB) for a high pin count area array packaged device, the board having a plurality of layers with routes for connecting the device onto the board, comprising:
   on a surface layer of said board,
      a surface ball grid array (BGA) of surface contacts connected to through-board vias, wherein two adjacent rows of through-board vias are distanced at one interconnect pitch P and two adjacent columns of through-board vias are distanced at two pitch 2P; and
      a column of external surface contacts connected to micro-vias that terminate on the first internal layer of said board for providing contact between said surface layer and the first internal layer;
   on the second and subsequent internal layers of the board,
      an internal array of through-board vias corresponding to said surface array; and
      a plurality of routing channels created between said through-board vias, whereby the routing capacity is widened to 2P on the second and all subsequent layers, while the interconnect pitch P on the surface of the board remains equal to that of the device.

2. A board as claimed in claim 1, wherein the micro-vias are used for routing signals on the first internal layer of the board.

3. A board as claimed in claim 1, wherein the through-board vias are used for routing power and ground connections on second and subsequent internal layers of the board.

4. A board as claimed in claim 1, used for an ASIC BGA package.

5. A board as claimed in claim 1, wherein a column of micro-vias is placed only between selected columns of through-board vias, and the reminder of the columns not occupied by micro-vias being provided with through-board vias.

* * * * *